(12) United States Patent
Green

(10) Patent No.: US 6,694,026 B1
(45) Date of Patent: Feb. 17, 2004

(54) DIGITAL STEREO RECOVERY CIRCUITRY AND METHOD FOR RADIO RECEIVERS

(75) Inventor: Brian D. Green, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/265,752

(22) Filed: Mar. 10, 1999

(51) Int. Cl.[7] .............. H04H 5/00; H03L 5/00; H03L 7/00; H03B 1/00; H03B 7/00; H04L 7/04; H04L 7/06

(52) U.S. Cl. .............. 381/3; 381/2; 331/182; 331/15; 331/74; 455/260; 375/362; 375/364

(58) Field of Search .............. 381/2–13; 455/205, 455/214, 260; 375/362, 364, 376; 331/15–17, 23, 25, 64, 74, 175, 177 R, 182; 332/125–127; 360/28, 30, 51

(56) References Cited

U.S. PATENT DOCUMENTS

| | | | | |
|---|---|---|---|---|
| 3,609,558 A | * | 9/1971 | Ise et al. | 455/337 |
| 5,311,318 A | * | 5/1994 | Dobrovolny | 348/731 |
| 5,327,132 A | * | 7/1994 | Whitecar et al. | 341/141 |
| 5,440,586 A | * | 8/1995 | Den Braber | 375/327 |
| 5,467,399 A | * | 11/1995 | Whitecar | 381/4 |
| 5,507,024 A | * | 4/1996 | Richards, Jr. | 455/260 |
| 5,581,584 A | * | 12/1996 | Inoue et al. | 375/376 |
| 5,581,617 A | * | 12/1996 | Schotz et al. | 381/14 |
| 5,751,197 A | * | 5/1998 | Boling, III | 331/107 A |
| 5,883,930 A | * | 3/1999 | Fukushi | 375/376 |
| 6,160,444 A | * | 12/2000 | Horsfall et al. | 329/325 |
| 6,161,003 A | * | 12/2000 | Lo Curto et al. | 455/260 |
| 6,225,928 B1 | * | 5/2001 | Green | 341/143 |
| 6,233,295 B1 | * | 5/2001 | Wang | 375/364 |
| 6,307,896 B1 | * | 10/2001 | Gumm et al. | 375/316 |
| 6,389,270 B1 | * | 5/2002 | Nohrden et al. | 455/161.1 |

* cited by examiner

Primary Examiner—Minsun Oh Harvey
Assistant Examiner—Laura A. Grier
(74) Attorney, Agent, or Firm—Steven Lin, Esq.

(57) ABSTRACT

Stereo recovery circuitry for a digital receiver is disclosed that provides increased accuracy and efficiency in recovering stereo signal information from transmitted stereo signals. The stereo decoder includes a digitally controlled oscillator that recovers a pilot tone signal from transmitted stereo signal information. By processing demodulated stereo signals on the digital side and digitally controlling the oscillator, the stereo decoder has increased efficiency and accuracy. In one embodiment, the oscillator may be a phase-locked-loop having a loop filter and an amplitude stabilized tunable resonator. Additional circuitry is disclosed for utilizing the pilot tone signal to recover left and right channel signal information from the demodulated stereo signals.

17 Claims, 5 Drawing Sheets

DIGITAL STEREO RECOVERY CIRCUITRY AND METHOD FOR RADIO RECEIVERS

This application is related to the following U. S. patent applications that have been filed concurrently herewith and that are hereby incorporated by reference in their entirety: Ser. No. 09/265,663, entitled "Method and Apparatus for Demodulation of Radio Data Signals" by Eric J. King and Brian D. Green.; Ser. No. 09/266,418, entitled "Station Scan Method and Apparatus for Radio Receivers" by James M. Nohrden and Brian P. Lum Shue Chan; Ser. No. 09/265,659, entitled "Method and Apparatus for Discriminating Multipath and Pulse Noise Distortions in Radio Receivers" by James M. Nohrden, Brian D. Green and Brian P. Lum Shue Chan; Ser. No. 09/414,209, entitled "Quadrature Sampling Architecture and Method For Analog-To-Digital Converters" by Brian P. Lum Shue Chan, Brian D. Green and Donald A. Kerth; and Ser. No. 09/265,758, entitled "Complex Bandpass Modulator and Method for Analog-to-Digital Converters" by Brian D. Green.

BACKGROUND OF THE INVENTION

1. Field of the Invention

The present invention relates generally to circuits for recovering stereo signals in radio receivers. More specifically, the present invention relates to techniques for recovering a pilot tone and left and right channel FM stereo signals from demodulated FM signals.

2. Description of the Related Art

Many radio transmitters radiate a transmission signal including stereo signals, such as FM stereo signals. To recover stereo signal information from the transmitted FM stereo signals, a radio receiver will demodulate and isolate the FM stereo signal information within the FM stereo signals. The transmitted FM stereo signals typically include left-minus-right (L–R) signal information, left-plus-right (L+R) signal information and a pilot tone. For example, once modulated, the left-minus-right (L–R) signal information may be centered at 38 kHz. The left-plus-right (L+R) signal information may be centered at baseband or DC. The pilot tone may be located at 19 kHz. Typically, the 19 kHz pilot tone is used to demodulate the stereo signal information into its constituent left (L) and right (R) components. Prior stereo decoders, however, have suffered from various inefficiencies and inaccuracies in recovering the 19 kHz pilot tone and, thereby, in recovering the stereo signal information embedded within the FM stereo signal.

SUMMARY OF THE INVENTION

According to the present invention, stereo recovery circuitry for a radio receiver provides increased accuracy and efficiency in recovering stereo signal information from transmitted stereo signals. The stereo decoder includes a digitally controlled oscillator that recovers a pilot tone signal from transmitted stereo signal information. By processing demodulated stereo signals on the digital side and digitally controlling the oscillator, the stereo decoder has increased efficiency and accuracy. In one embodiment, the oscillator may be a phase-locked-loop having a loop filter and an amplitude controlled tunable resonator. Additional circuitry is disclosed for utilizing the pilot tone signal to recover left and right channel signal information from the demodulated stereo signals.

DESCRIPTION OF THE PREFERRED EMBODIMENTS

Figure 1:
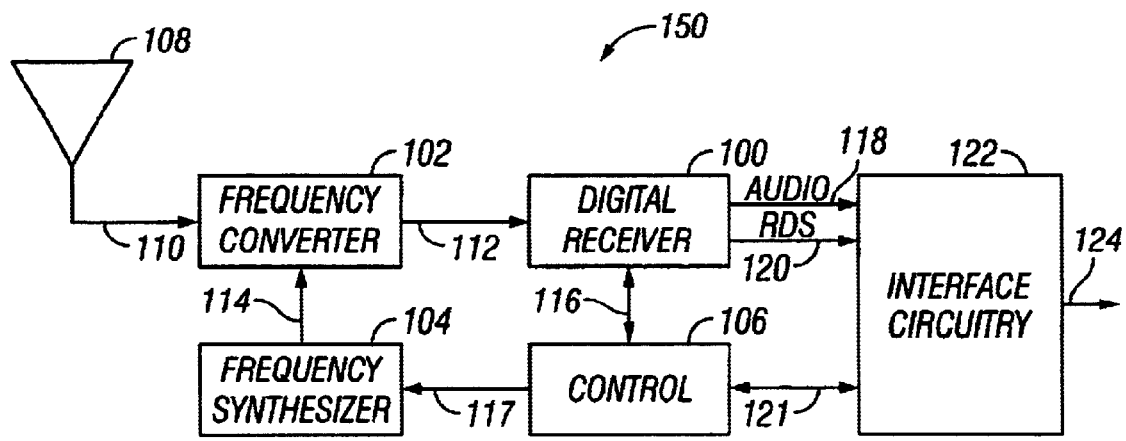
FIG. 1 is a block diagram of an embodiment for an intermediate frequency (IF) AM/FM radio receiver.

Referring now to FIG. 1, a block diagram is depicted for an embodiment of an intermediate frequency (IF) AM/FM radio receiver 150. Frequency converter circuitry 102 converts a radio frequency (RF) signal 110 received from the antenna 108 to an IF frequency 112. The frequency converter circuitry 102 utilizes a mixing signal 114 from a frequency synthesizer 104 to perform this conversion from the RF frequency range to the IF frequency range. Control circuitry 106 may apply a control signal 117 to frequency synthesizer 104 to choose the mixing signal 114 depending upon the station or channel that is desired to be received by the IF receiver 150. The digital receiver circuitry 100 processes the IF signal 112 and produces desired output signals, for example, audio output signals 118 and radio data system (RDS) output signals 120. These output signals may be provided to interface circuitry 122 and output to external devices through interface signals 124. The control circuitry 106 may communicate with the digital receiver circuitry 100 through signals 116 and may communicate with the interface circuitry 122 through signals 121. In addition, control circuitry 106 may communicate, with external devices through the interface circuitry 122.

Figure 2:
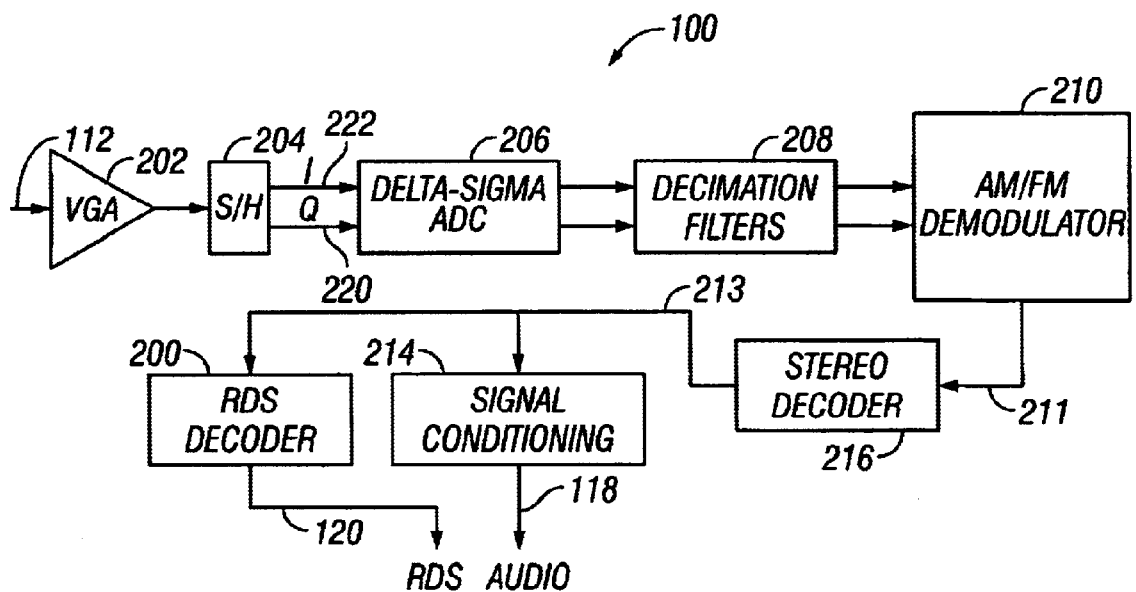
FIG. 2 is a block diagram of an embodiment for the digital receiver within the radio receiver.

FIG. 2 is a block diagram of an embodiment for the digital receiver 100. The IF input signal 112 is amplified by a variable gain amplifier (VGA) 202. The output of the variable gain amplifier (VGA) 202 may be filtered with anti-aliasing filters if desired. Sample-and-hold (S/H) circuitry 204 samples the resulting signal and produces an in-phase (I) output signal and a quadrature (Q) output signal. The analog-to-digital converter (ADC) circuitry 206 processes the I and Q signals to form an I digital signal and a Q digital signal. The ADC circuitry 206 may be for example two fifth order low-pass, or bandpass, delta-sigma ADCs that operate to convert the I and Q signals to one-bit digital I and Q data streams. The digital output of the ADC circuitry 206 is passed through digital decimation filters 208 to complete channelization of the signals. The decimation filters 208 may also remove quantization noise caused by ADC 206 and provide anti-aliasing filtering.

Demodulation of the decimated I and Q data signals may be performed by AM/FM demodulator 210. The demodulator 210 may include for example a CORDIC processor that processes the digital I and Q data streams and outputs both the angle and magnitude of the I and Q digital data. For FM demodulation, the demodulator 210 may also perform discrete-time differentiation on the angle value outputs.

Assuming the signals received are FM stereo signals, the output of the demodulator will be an FM multiplex spectrum signal 211. This FM multiplex signal 211 is then processed by stereo decoder 216 to decode the left and right channel information from the multiplexed stereo signal. The stereo decoder 216 may also provide additional signal processing as desired. Thus, the output signals 213 from the stereo decoder 216 may include, for example, a left channel (L) signal, a right channel (R) signal, a left-minus-right (L−R) signal, a left-plus-right (L+R) signal, and a 19 kHz pilot tone.

The signal conditioning circuitry 214 and the RDS decoder 200 receive signals 213 from the stereo decoder 216. It is noted that the signals received by the RDS decoder 200 and the signal conditioning circuitry 214 may be any of the signals produced by stereo decoder 216 and each may receive different signals from the other, as desired. The signal conditioning circuitry 214 may perform any desired signal processing, including for example detecting weak signal conditions, multi-path distortions and impulse noise and making appropriate modifications to the signals to compensate for these signal problems. The output of the signal conditioning circuitry 214 provides the desired audio output signals 118. The RDS decoder 212 recovers RDS data for example from a left-minus-right (L−R) signal available from the stereo decoder 216. The output of the RDS decoder 212 provides the desired RDS output signals 120, which may include RDS clock and data signal information.

Figure 4:
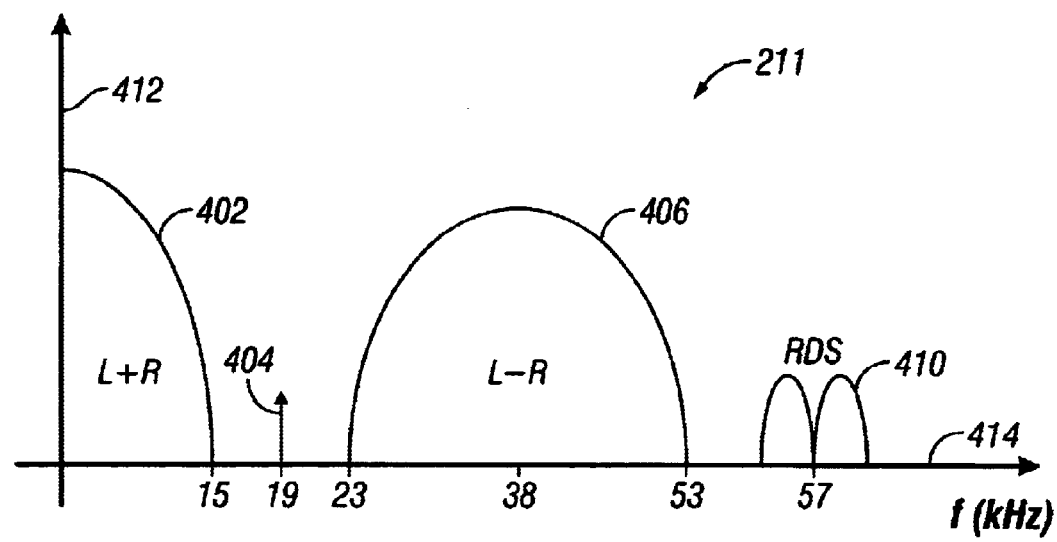
FIG. 4. is a graphical representation of a multiplex signal frequency spectrum for a demodulated FM signal.

FIG. 4 is a graphical representation of a multiplex frequency spectrum for a received FM multiplex signal 211. The y-axis 412 represents the magnitude of the signal 211, and the x-axis 414 represents the frequency of the signal 211. Stereo signal information typically resides in two different frequency bands. The first stereo signal information is the left-plus-right (L+R) signal 402 that resides in the region from 0–15 kHz. The second stereo signal information is the left-minus-right (L−R) signal 406 that resides in the region from 23–53 kHz. A 19 kHz pilot signal 404 is also included within the RF signal 110, which may be recovered from the FM multiplex signal 211 and used to move the L−R signal 406 to baseband. In addition to these signals, the RF signal 110 may include RDS data information in an RDS signal 410, which may be two signal lobes on either side of 57 kHz.

Figure 3:
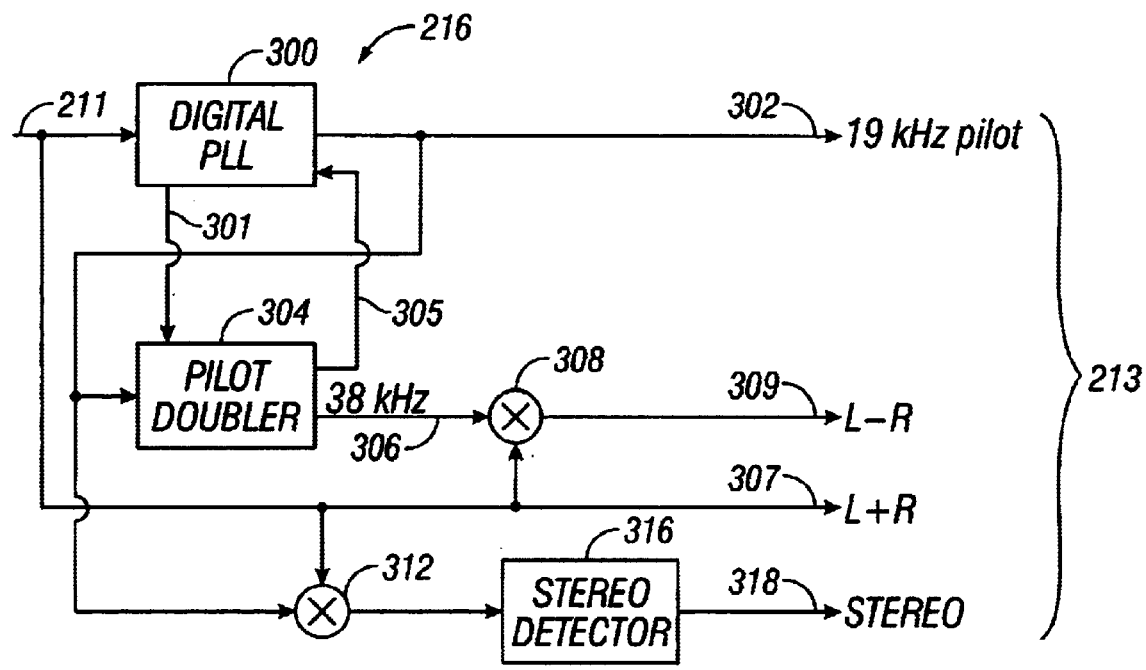
FIG. 3 is a block diagram of an embodiment for a digital stereo decoder according to the present invention.

FIG. 3 is a block diagram of an embodiment for a stereo decoder 216 according to the present invention. A digital phase-locked-loop (PLL) 300 receives the demodulated stereo signal 211 from demodulator 210 and produces an output signal 302 by isolating the 19 kHz pilot 404, which is depicted in FIG. 4. The digital PLL 300 also receives a signal 305 from the pilot doubler 304. The demodulated stereo signal 211 also becomes the output signal 307, which includes the left-plus-right (L+R) signal 402 at baseband, as is depicted in FIG. 4. The pilot doubler 304 receives the 19 kHz pilot output signal 302, as well as a signal 301, from the digital PLL 300 and produces an output signal 306 at 38 kHz or double the pilot frequency. Mixer 308 mixes this 38 kHz signal 306 with the demodulated stereo signal 211 to generate an output signal 309, which includes the left-minus-right (L−R) signal 406 at baseband. Mixer 312 mixes the demodulated stereo signal 211 with the 19 kHz pilot signal 302 and provides the resulting output signal to stereo detector 316. The output signal (STEREO) 318 from the stereo detector 316 provides an indication of whether the input signal was a stereo signal.

In the embodiment depicted, the signal 213 provided from the stereo decoder 216 includes the 19 kHz output signal 302, the left-minus-right (L−R) output signal 309, the left-plus-right (L+R) output signal 307, and the stereo indication output signal 318. It is noted that these output signals may be filtered or further processed before being utilized by other circuitry within the digital receiver 100. For example, the left-minus-right (L−R) output signal 309 and the left-plus-right (L+R) output signal 307 may be passed through low pass filters to remove unwanted high frequency information and noise. Significantly, the processing with the stereo decoder of the present invention is accomplished on the digital side, allowing for greater precision and accuracy.

Figure 5:
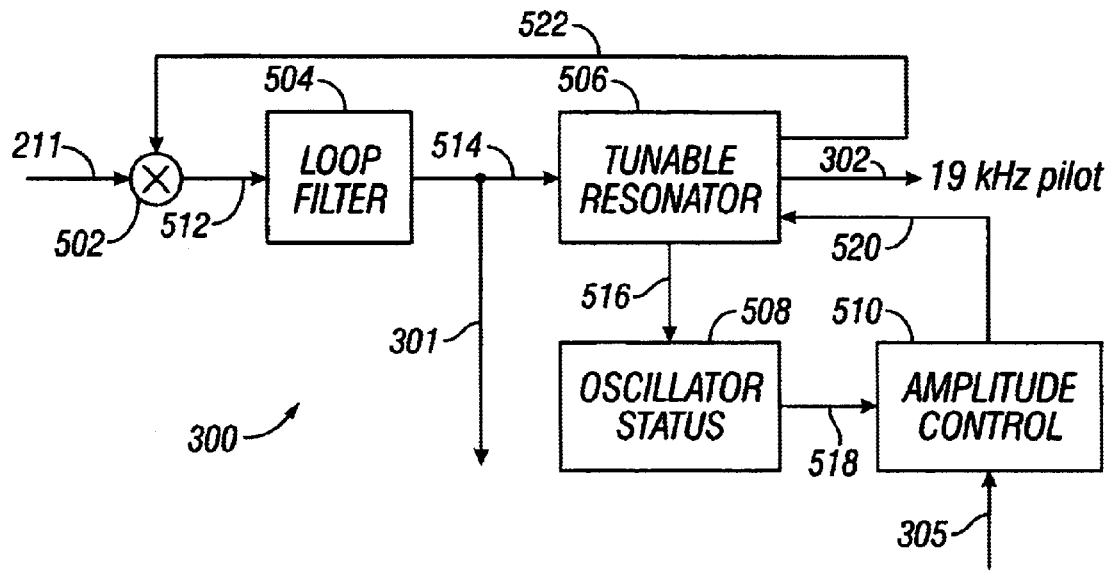
FIG. 5 is a block diagram of an embodiment for a digital phase-locked-loop (PLL).

FIG. 5 is a block diagram of an embodiment for the digital PLL 300. A mixer 502 mixes the demodulated stereo signal 211 with a feedback signal 522. The resulting signal 512 is passed through a loop filter 504 that may be, for example, a 3rd-order elliptic low-pass filter followed by an integrator. A tunable resonator 506 receives the filtered frequency control signal 514 and produces the 19 kHz pilot output signal 302. The output of the loop filter 504 is also the signal 301, that is provided from the digital PLL 300 to the pilot doubler 304. The tunable resonator 506 also produces the feedback signal 522 and status signals 516 that are utilized by oscillator status circuitry 508. Amplitude control circuitry 510 receives an output signal 518 from oscillator status circuitry 508 and signal 305 from the pilot doubler 304. Amplitude control circuitry 510 provides a control signal 520 to the tunable resonator 506.

In operation, the tunable resonator 506 has an amplitude-stabalized sinusoidal output with controllable frequency and forms the core of the digital PLL 300, which locks onto the 19 kHz pilot tone. The pilot doubler 304 may square the recovered 19 kHz pilot tone signal 302 and then remove a DC value to generate the 38 kHz output signal 306 that is utilized to modulate down the demodulated signal 211 to produce the L−R signal 309. The DC value may be used as the signal 305 that is provided to the amplitude control circuitry 510 to control the amplitude of the tunable resonator 506. This DC value may be recovered from the squared 19 kHz pilot tone signal by using, for example, a second-order finite-impulse-response (FIR) filter having a time-varying tunable zero that tracks the 38 kHz frequency.

Figure 6:
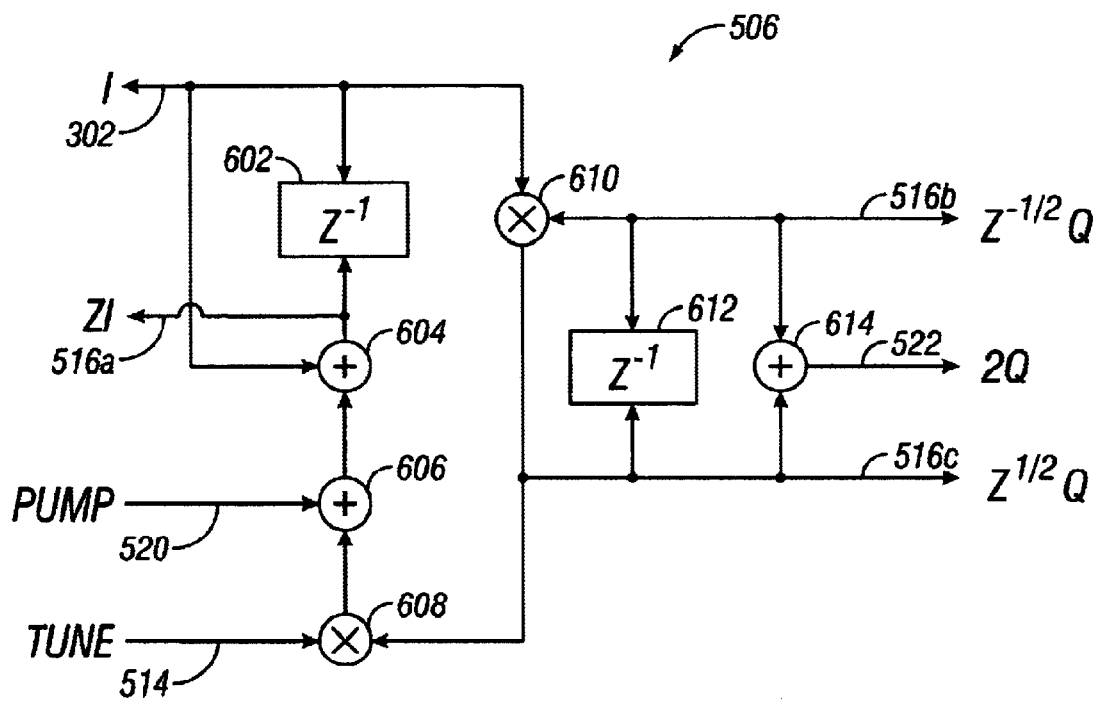
FIG. 6 is a detailed diagram of an embodiment for a tunable resonator.

FIG. 6 is a detailed diagram of an embodiment for the tunable resonator 506. Input signals to the tunable resonator 506 are the signal (PUMP) 520 from the amplitude control circuitry 510 and the filtered frequency control signal (TUNE) 514 from the loop filter 504. The tunable resonator 506 produces the 19 kHz pilot output signal (I) 302 and the feedback signal (2Q) 522. The tunable resonator 506 also produces several status signals 516 including a signal $(z^{-\frac{1}{2}}Q)$ 516b, signal $(z^{+\frac{1}{2}}Q)$ 516c, and signal (zI) 516a which is a time-advanced version of the pilot signal.

The filtered frequency control signal (TUNE) 514 is mixed by mixer 608 with the output signal $(z^{+\frac{1}{2}}Q)$ 516c and then combined by adder 606 with the input signal (PUMP) 520. The resulting signal is then added by adder 604 to the pilot output signal (I) 302 to form the output signal (zI) 516a. The output signal (zI) 516a is passed through a delay circuit $(z^{-1})$ 602 to produce the pilot output signal (I) 302. The pilot output signal (I) 302 is combined by adder 610 with the output signal $(z^{-\frac{1}{2}}Q)$ 516b to produce the output signal $(z^{+\frac{1}{2}}Q)$ 516c. The output signal $(z^{+\frac{1}{2}}Q)$ 516c is passed through a delay circuit $(z^{-1})$ 612 to produce the output signal $(z^{-\frac{1}{2}}Q)$ 516b. The output signal $(z^{-\frac{1}{2}}Q)$ 516b and the output signal $(z^{+\frac{1}{2}}Q)$ 516c are combined by adder 614 to produce the feedback signal (2Q) 522.

Figure 7:
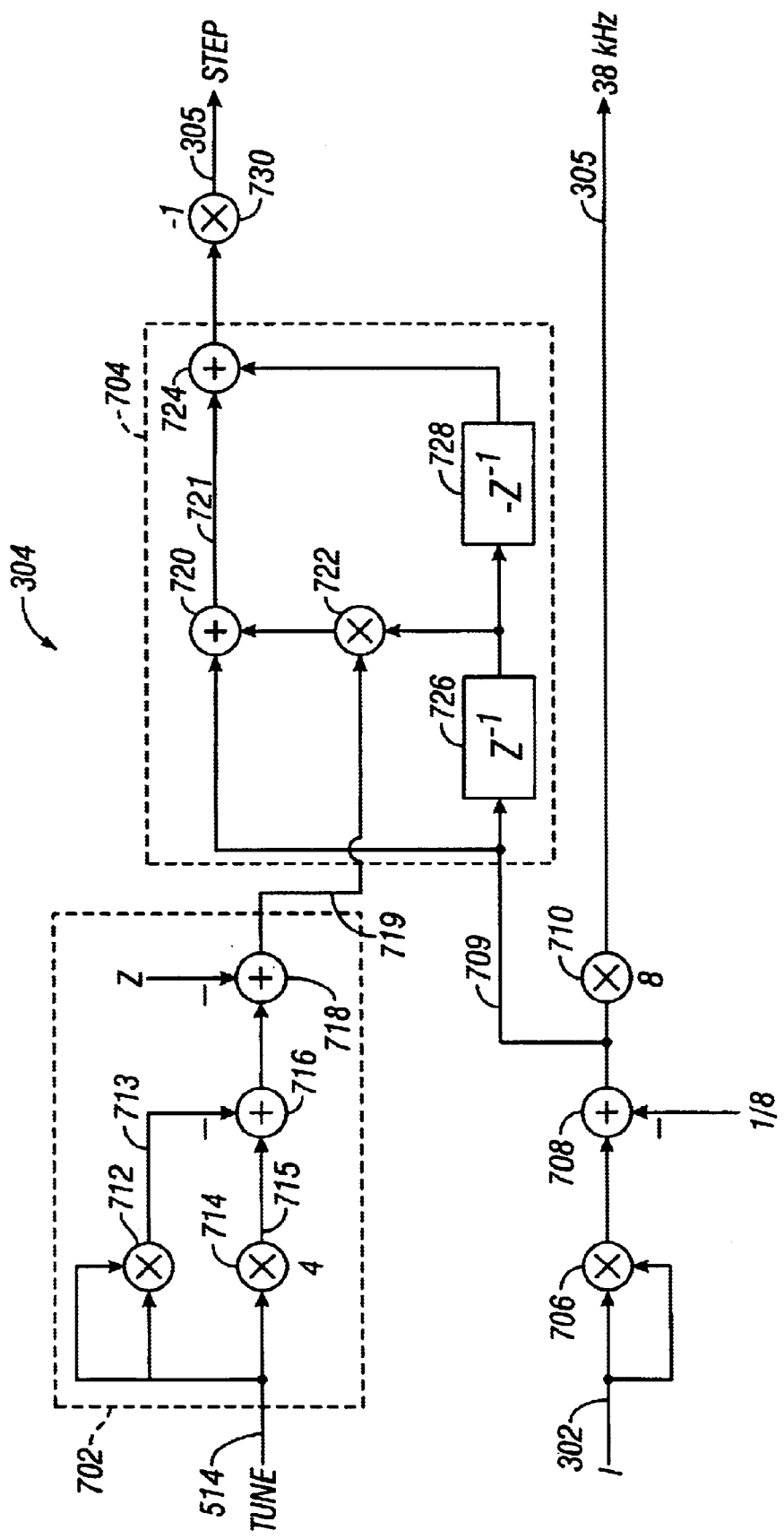
FIG. 7 is a detailed diagram of an embodiment for a pilot doubler.

FIG. 7 is a detailed diagram of an embodiment for the pilot doubler 304. The pilot doubler 304 includes a coefficient generator 702 and a filter 704. The input signals include the pilot output signal (I) 302 and the filtered frequency control signal (TUNE) 514. The output signals include the 38 kHz doubled pilot signal 306 and the signal (STEP) 305 provided by the pilot doubler 304 to the digital PLL 300.

The pilot output signal (I) 302 is mixed with itself by mixer 706 and then combined with a $-\frac{1}{8}$ coefficient signal by adder 708. The resulting signal 709 is then multiplied by multiplier block 710 having a constant value of 8 to generate the 38 kHz doubled pilot signal 306. Within the coefficient generator 702, the filtered frequency control signal (TUNE) 514 is squared by multiplier 712 to produce signal 713. Signal 713 is then passed through 4× gain block 714 to produce signal 71,5. Signal 713 is subtracted from signal 715 by adder 716 and then a +2 coefficient signal is subtracted by adder 718 to produce coefficient output signal 719. Within the filter 704, the coefficient output signal 719 controls the gain of multiplier 722. Multiplier 722 operates, on signal 709, which has been first passed through delay circuitry ($z^{-1}$) 726. The resulting signal is combined with the signal 709 by the adder 720 to produce signal 721. Signal 721 is combined by adder 724 with the signal 709 that has first been passed through both delay circuitry ($z^{-1}$) 726 and delay circuitry ($z^{-1}$) 728. The output signal from adder 724 is passed through a $-1\times$ gain block 730 to produce the output signal (STEP) 305.

In operation, the pilot doubler 304 generates twice the output frequency of the tunable resonator 506, which is the recovered 19 kHz pilot tone 302. The pilot doubler 304 does so by squaring the recovered pilot tone 302 and then by removing an expected amount of DC with the nominal oscillator amplitude for the tunable resonator 506 being selected as 0.5. A residual DC value may then be extracted from the squared signal using, for example, a second-order FIR filter 704 to remove the 2× or 38 kHz component. Advantageously, the FIR coefficient control signal 719 is non-fixed and time-varying, being dynamically generated by coefficient generator 702 from the oscillator tuning value, which is signal (TUNE) 514. The residual or filtered DC value may then be used to provide the signal (STEP) 305 and thereby close the loop of oscillator amplitude control circuitry 510, driving any residual DC within the 38 kHz output to zero and simultaneously controlling the amplitude of the resonator pilot output signal (I) 302 to keep it substantially at a value of 0.5. In the embodiment depicted, this output signal (STEP) 305 is used to control pumping of the oscillator near the positive maximum of the cycle, so the $-1$ coefficient block 730 is required to get a proper sign for amplitude correction.

Figure 8:
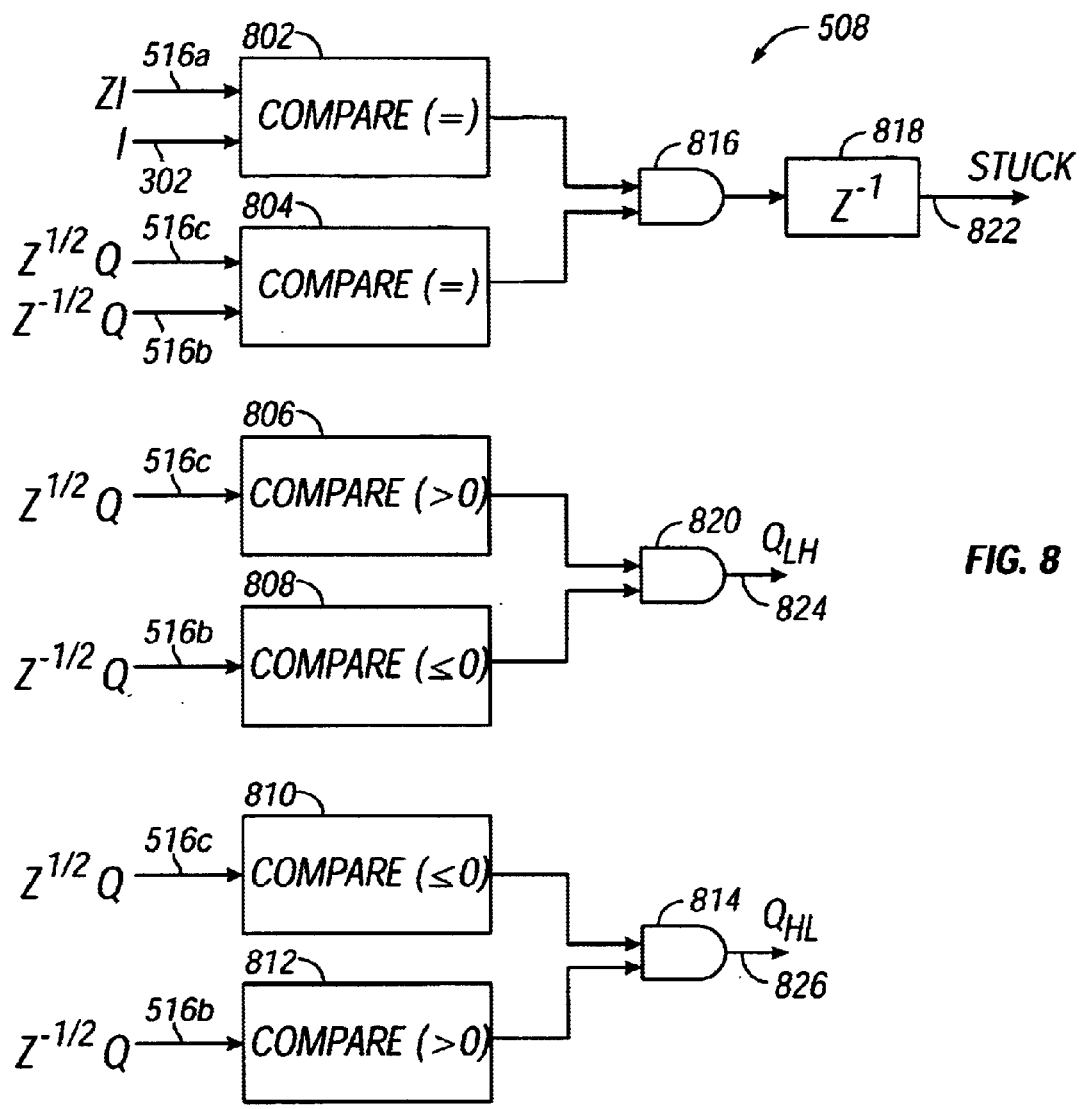
FIG. 8 is a detailed diagram of an embodiment for oscillator status circuitry.

FIG. 8 is a detailed diagram of an embodiment for the oscillator status circuitry 508. The inputs include the pilot output signal (I) 302 and the status signals 516 including the signal (zI) 516$a$, the signal ($z^{-\frac{1}{2}}Q$) 516$b$, and the signal ($z^{+\frac{1}{2}}Q$) 516$c$. The compare block (=) 802 receives the signal (zI) 516$a$ and the pilot output signal (I) 302 and provides an indication to AND gate 816 of whether or not these two signals are equivalent. The compare block (=) 804 receives the signal ($z^{-\frac{1}{2}}Q$) 516$b$ and the signal ($z^{+\frac{1}{2}}Q$) 516$c$ and provides an indication to AND gate 816 of whether or not these two signals are equivalent. The output of AND gate 816 is passed through delay circuitry ($z^{-1}$) 818 to provide the output signal (STUCK) 822.

The compare block (>0) 806 provides an indication to AND gate 820 of whether the signal ($z^{+\frac{1}{2}}Q$) 516$c$ is greater than zero. The compare block ($\leq 0$) 808 provides an indication to AND gate 820 of whether the signal ($z^{-\frac{1}{2}}Q$) 516$b$ is less than or equal to zero. The output signal ($Q_{LH}$) 824 of AND gate 820 provides an indication of a negative-to-positive transition for the input signal. The compare block (>0) 812 provides an indication to AND gate 814 of whether the signal ($z^{-\frac{1}{2}}Q$) 516$b$ is greater than zero. The compare block ($\leq 0$) 810 provides an indication to AND gate 814 of whether the signal ($z^{+\frac{1}{2}}Q$) 516$c$ is less than or equal to zero. The output signal ($Q_{HL}$) 826 of AND gate 814 provides an indication of a postive-to-negative transition for the input signal.

In operation, the oscillator status circuitry 508 monitors the oscillator output signals 516 from the tunable resonator 506. The oscillator status circuitry 508 generates the logic signal ($Q_{LH}$) 824 and the logic signal ($Q_{HL}$) 826 at the zero-crossings of the Q output signal 522 for the tunable resonator 506. These logic signals 824 and 826 correspond to maximum or minimum of the I output signal 302 for the tunable resonator 506 and are used by the amplitude control circuitry 510 to control the amplitude of the oscillator. The oscillator status circuitry 508 also generates the output signal (STUCK) 822, which is asserted if neither oscillator state is changing. This output signal (STUCK) 822 is used, for example, by the amplitude control circuitry 510 on startup to help get the oscillations for the tunable resonator 506 started.

Figure 9:
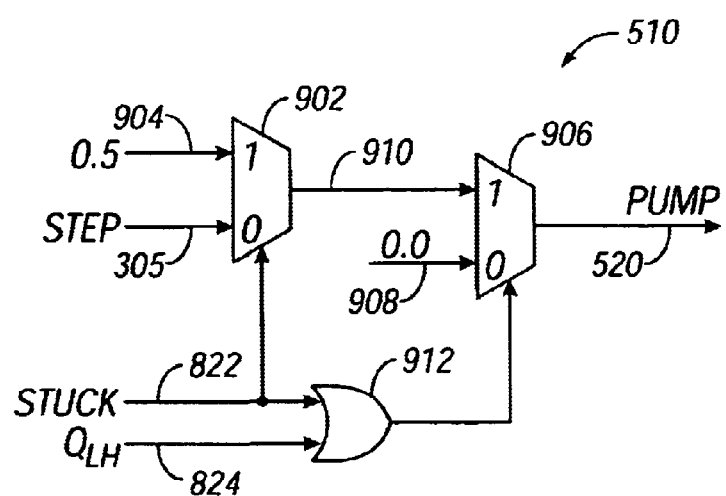
FIG. 9 is a detailed diagram of an embodiment for amplitude control circuitry.

FIG. 9 is a detailed diagram of an embodiment for the amplitude control circuitry 510. Input signals include the signal (STEP) 305 from the pilot doubler 304, the signal (STUCK) 822 from the oscillator status circuitry 508, and the negative-to-positive transition indicator signal ($Q_{LH}$) 826 from the oscillator status circuitry 508. The multiplexer (MUX) 902 has a signal 904 with a value of 0.5 as one input and the signal (STEP) 305 as the other input signal. The signal (STUCK) 822 controls the MUX 902 with a "0" selecting the signal (STEP) 305 and a "1" selecting the signal 904. The output of MUX 902 is one input to MUX 906 with the other input being the signal 908 with a value of 0.0. The MUX 906 is controlled by the output signal from OR gate 912 with a "1" selecting the signal 910 and a "0" selecting the signal 908. The OR gate 912 receives as inputs the signal (STUCK) 822 and the negative-to-positive transition indicator signal ($Q_{LH}$) 824. The output of MUX 906 is the signal (PUMP) 520 provided by the amplitude control circuitry 510 to the tunable resonator 506.

In operation, the amplitude control circuitry 510 generates a signal (PUMP) 520 that represents a value for the oscillator at the positive-going zero-crossing of the Q output signal 522 from the tunable resonator 506. This positive-going zero-crossing is indicated by the output signal ($Q_{LH}$) 824 and corresponds to a maximum for the I output signal 302 from the tunable resonator 506. Changing the amplitude of the oscillations at this point tends to minimize the phase step introduced to the oscillations and thereby tends to minimize the interaction between amplitude and phase control. The amplitude control applied is the residual DC value signal (STEP) 305 that is generated by the pilot doubler 304. If the tunable resonator 506 is stuck, it is pumped by the control signal (STUCK) 822 to a nominal amplitude of 0.5 for the I output signal 302 from the tunable resonator 506.

What is claimed is:

1. A radio receiver system for processing stereo signal information transmitted by radio stations, comprising:

an antenna;

a frequency converter coupled to receive signals from the antenna, the signals including stereo signal information;

a digital receiver coupled to receive signals from the frequency converter; and stereo recovery circuitry within the digital receiver including a digitally controlled oscillator having a digital phase-locked-loop and a pilot tone signal as an output signal, the pilot tone signal being recovered from the stereo signal information, wherein the digital phase-locked-loop comprises a loop filter coupled to a tunable resonator, the tunable resonator having the pilot tone signal as the output signal.

2. The radio receiver system of claim 1, wherein the stereo recovery circuitry further comprises pilot doubling circuitry coupled to receive the pilot tone signal and to output a doubled pilot tone signal having double the frequency of the pilot tone signal.

3. The radio receiver system of claim 1, wherein the stereo recovery circuitry recovers left and right channel signal information from the stereo signal information.

4. The radio receiver system of claim 1, wherein the digitally controlled oscillator is a digital phase-locked-loop that locks to the frequency of the pilot tone signal.

5. The radio receiver system of claim 4, wherein the phase-locked-loop comprises a loop filter coupled to a tunable resonator that is amplitude stabilized.

6. Stereo recovery circuitry for a digital receiver, comprising:

an input signal including stereo signal information; and a digitally controlled oscillator comprising a digital phase-locked-loop and having a pilot tone signal as an output, wherein the pilot tone signal is recovered from the stereo signal information and wherein the digital phase-locked-loop comprises a loop filter coupled to a tunable resonator, the tunable resonator having the pilot tone signal as the output.

7. The stereo recovery circuitry of claim 6, wherein the digital phase-locked-loop further comprises amplitude control circuitry coupled to the tunable resonator to control an output amplitude for the pilot tone output signal from the tunable resonator.

8. The stereo recovery circuitry of claim 7, wherein the amplitude control circuitry receives a logic status signal indicative of a zero-crossing transition for the pilot tone output signal and receives an amplitude signal indicative of an amplitude for the pilot tone output signal.

9. The stereo recovery circuitry of claim 8, further comprising oscillator status circuitry coupled to receive signals from the tunable resonator and having the logic status signal as an output.

10. The stereo recovery circuitry of claim 9, further comprising pilot doubling circuitry having the pilot tone signal as an input and the amplitude signal as an output.

11. The stereo recovery circuitry of claim 10, wherein the pilot doubling circuitry comprises a filter that has a response which is controlled by a non-fixed filter coefficient signal.

12. The stereo recovery circuitry of claim 11, wherein the pilot doubling circuitry further comprises a coefficient generator having a filtered tuning signal from the loop filter as an input and having the non-fixed filter coefficient signal as an output.

13. A method for decoding stereo signal information, comprising:

receiving signals including stereo signal information;

utilizing a digitally controlled oscillator to recover a pilot tone signal from the stereo signal information wherein the digitally controlled oscillator is a digital-phase-locked-loop including a loop filter and a digitally controlled tunable resonator, the tunable resonator having the pilot tone signal as the output; and wherein said oscillator is digitally controlling an amplitude for the tunable resonator.

14. The method of claim 13, wherein the controlling step is implemented utilizing an amplitude signal indicative of an amplitude for the pilot tone signal.

15. The method of claim 14, further comprising generating the amplitude signal by processing an output from the loop filter to produce an indication of the amplitude for pilot tone signal.

16. The method of claim 13, further comprising doubling the frequency of the pilot tone signal to generate a doubled pilot tone signal having double the frequency of the pilot tone signal.

17. The method of claim 13, further comprising recovering left and right channel information from the stereo signal information.

* * * * *